(12) United States Patent
Kim et al.

(10) Patent No.: US 10,431,769 B2
(45) Date of Patent: Oct. 1, 2019

(54) ORGANIC LIGHT EMITTING DISPLAY DEVICE

(71) Applicant: LG DISPLAY CO., LTD., Seoul (KR)

(72) Inventors: DongYoon Kim, Paju-si (KR); YounYeol Yu, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/260,194

(22) Filed: Jan. 29, 2019

(65) Prior Publication Data

US 2019/0157608 A1 May 23, 2019

Related U.S. Application Data

(63) Continuation of application No. 16/030,135, filed on Jul. 9, 2018, now Pat. No. 10,256,431, which is a continuation of application No. 15/373,848, filed on Dec. 9, 2016, now Pat. No. 10,069,101.

(30) Foreign Application Priority Data

Dec. 15, 2015 (KR) .................. 10-2015-0178905

(51) Int. Cl.
*H01L 29/08* (2006.01)
*H01L 51/52* (2006.01)
*H01L 27/32* (2006.01)

(52) U.S. Cl.
CPC ...... *H01L 51/5237* (2013.01); *H01L 27/3244* (2013.01); *H01L 51/5246* (2013.01); *H01L 51/5253* (2013.01); *H01L 27/3276* (2013.01); *H01L 51/5243* (2013.01); *H01L 2251/5338* (2013.01)

(58) Field of Classification Search
CPC . H01L 51/52; H01L 51/5237; H01L 51/5253; H01L 51/5246; H01L 27/3244; H01L 27/3276

See application file for complete search history.

(56) References Cited

U.S. PATENT DOCUMENTS

| | | |
|---|---|---|
| 2003/0048074 A1 | 3/2003 | Ni et al. |
| 2003/0113581 A1 | 6/2003 | Gotou |
| 2003/0143423 A1 | 7/2003 | McCormick et al. |
| 2005/0184656 A1 | 8/2005 | Kim et al. |
| 2007/0176553 A1 | 8/2007 | Kwak |

(Continued)

FOREIGN PATENT DOCUMENTS

| | | |
|---|---|---|
| CN | 101901824 A | 12/2010 |
| CN | 101908555 A | 12/2010 |

(Continued)

*Primary Examiner* — Phuc T Dang
(74) *Attorney, Agent, or Firm* — Birch, Stewart, Kolasch & Birch, LLP

(57) ABSTRACT

A flexible organic light emitting device including a flexible substrate having an active area and a pad area; an organic light emitting diode layer disposed on the active area; an adhesive layer disposed on the organic light emitting diode layer; an encapsulation substrate disposed on the adhesive layer; a cover layer disposed between the active area and the pad area; and a back film disposed on a lower surface of the flexible substrate, further the encapsulation substrate has a curved upper surface outside the active area, also the cover layer decreases in thickness from the active area toward the pad area.

16 Claims, 7 Drawing Sheets

(56) References Cited

U.S. PATENT DOCUMENTS

| | | |
|---|---|---|
| 2007/0222384 A1 | 9/2007 | Yonemoto |
| 2010/0301740 A1 | 12/2010 | Lee et al. |
| 2010/0301742 A1 | 12/2010 | Moriwaki |
| 2010/0308335 A1 | 12/2010 | Kim et al. |
| 2011/0012506 A1 | 1/2011 | Seo et al. |
| 2011/0101853 A1 | 5/2011 | Lee et al. |
| 2012/0139821 A1 | 6/2012 | Kim et al. |
| 2012/0261713 A1* | 10/2012 | Koo ............... H01L 51/524 257/100 |
| 2013/0048991 A1 | 2/2013 | Nakadaira |
| 2013/0069105 A1 | 3/2013 | Shi |
| 2013/0299789 A1 | 11/2013 | Yamazaki et al. |
| 2014/0104202 A1 | 4/2014 | Choi et al. |
| 2014/0117316 A1 | 5/2014 | Choi |
| 2014/0175972 A1 | 6/2014 | Lee et al. |
| 2014/0198435 A1 | 7/2014 | Yeh et al. |
| 2014/0239276 A1 | 8/2014 | Lin et al. |
| 2014/0291662 A1 | 10/2014 | Baisl |
| 2014/0374719 A1* | 12/2014 | Cho ............... H01L 51/524 257/40 |
| 2015/0035001 A1 | 2/2015 | Yamazaki et al. |
| 2015/0060786 A1* | 3/2015 | Kwak ............... H01L 51/5253 257/40 |
| 2015/0129855 A1 | 5/2015 | Bando et al. |
| 2015/0147831 A1* | 5/2015 | Lee ............... H01L 27/3276 438/23 |
| 2015/0333115 A1* | 11/2015 | Yang ............... H01L 27/12 257/40 |
| 2016/0133874 A1 | 5/2016 | Kim et al. |
| 2016/0155983 A1 | 6/2016 | Lee et al. |
| 2016/0205764 A1* | 7/2016 | Namkung ............... H01L 51/0097 361/749 |
| 2016/0254479 A1 | 9/2016 | Jeong et al. |
| 2016/0315284 A1 | 10/2016 | Jeon |
| 2017/0135216 A1 | 5/2017 | Cho et al. |
| 2017/0155086 A1 | 6/2017 | Kang |

FOREIGN PATENT DOCUMENTS

| | | |
|---|---|---|
| CN | 102569347 A | 7/2012 |
| JP | 2003-187963 A | 7/2003 |
| JP | 2005-63701 A | 3/2005 |
| JP | 2007-200848 A | 8/2007 |
| JP | 2007-220402 A | 8/2007 |
| JP | 2010-182634 A | 8/2010 |
| JP | 2010-282966 A | 12/2010 |
| JP | 2013-45522 A | 3/2013 |
| JP | 2014-197522 A | 10/2014 |
| JP | 2015-46385 A | 3/2015 |
| JP | 2015-153583 A | 8/2015 |
| WO | WO 2013/168660 A1 | 11/2013 |

* cited by examiner

ORGANIC LIGHT EMITTING DISPLAY DEVICE

CROSS REFERENCE TO RELATED APPLICATIONS

This Application is a Continuation of co-pending U.S. patent application Ser. No. 16/030,135 filed on Jul. 9, 2018, which is a Continuation of U.S. patent application Ser. No. 15/373,848 filed on Dec. 9, 2016 (Now U.S. Pat. No. 10,069,101, Issued on Sep. 4, 2018), which claims the priority benefit under 35 U.S.C. § 119(a) to Korean Patent Application No. 10-2015-0178905 filed in the Republic of Korea on Dec. 15, 2015, all of which are hereby expressly incorporated by reference into the present application.

BACKGROUND OF THE INVENTION

Field of the Invention

The present invention relates to an organic light emitting display device, and more particularly, to an organic light emitting display device that may improve reliability of an organic light emitting diode layer.

Discussion of the Related Art

Organic light emitting display devices are self-emitting devices having low power consumption, a fast response time, high emission efficiency, high luminance, and a wide viewing angle. The organic light emitting display devices are classified into a top emission type and a bottom emission type, based on a transmission direction of light emitted from an organic light emitting device. In the bottom emission type, a circuit element is disposed between an emission layer and an image displaying surface which results in a lower aperture ratio. In the top emission type, the circuit element is not disposed between the emission layer and the image displaying surface which results in a higher aperture ratio.

FIG. 1 is a cross-sectional view illustrating an organic light emitting display device of the related art. The organic light emitting display device includes a thin film transistor layer 11, an organic light emitting diode layer 12, an adhesive layer 13, and an encapsulation layer 14 that may all be formed in an active area AA on a substrate 10.

The thin film transistor layer 11 can include an active layer, a gate insulating film, a gate electrode, an interlayer dielectric, a source electrode, and a drain electrode. The thin film transistor layer 11 transfers a signal required for luminescence of the organic light emitting diode layer 12.

The organic light emitting diode layer 12 can include an anode electrode, an organic light emitting layer, and a cathode electrode. The organic light emitting diode layer 12 displays an image by using light emitted from the organic light emitting layer and passed through the cathode electrode.

The adhesive layer 13 is provided to cover an upper surface and a side of the organic light emitting diode layer 12. The adhesive layer 13 adheres the encapsulation substrate 14 to the organic light emitting diode layer 12.

The encapsulation substrate 14 is provided on the adhesive layer 13 to encapsulate the substrate 10 provided with the organic light emitting diode layer 12. The encapsulation substrate 14 encapsulating the substrate 10 protects elements provided in the substrate 10.

The aforementioned organic light emitting display device according to the related art can have a problem due to a crack in the organic light emitting display device. The encapsulation substrate 14 has a strong anti-water permeation effect in view of its material property, whereas the adhesive layer 13 has a weak anti-water permeation effect. For this reason, particles such as water permeate into an area S of the adhesive layer 13, which is provided at the side of the organic light emitting diode layer 12. A condition of the organic light emitting diode layer 12 can degrade due to the water permeation.

To prevent water from permeating into the area S of the adhesive layer 13, the organic light emitting display device according to the related art includes the adhesive layer 13 that is provided thinly. However, although water permeation through the side of the organic light emitting diode layer 12 can be prevented (i.e., avoided), a problem exists in that a crack in the organic light emitting display device is more likely to occur due to physical damage caused by an external impact. The crack in the organic light emitting display device can result in a dark spot occurring in some areas of the organic light emitting display device.

Next, FIG. 2 illustrates delamination between the organic light emitting layer and the cathode electrode of the organic light emitting display device according to the related art. In particular, a flexible organic light emitting display device according to the related art can have the problem of delamination between the organic light emitting layer and the cathode electrode of the organic light emitting diode layer 12. For a flexible screen, a position of a neutral plane can be controlled to be within a plurality of deposition structures shown in FIG. 1 to distribute an internal force appropriately. The encapsulation substrate 14 of the plurality of deposition structures can be provided to have a relatively great thickness. The neutral plane can be disposed at a boundary area between the adhesive layer 13 and the encapsulation substrate 14.

Due to the encapsulation substrate 14 having a relatively great thickness and the neutral plane being disposed at the boundary area, a problem of an application of an undesirable tensile force can occur. In particular, the problem is that a strong tensile force being applied to the organic light emitting diode layer 12 below the adhesive layer 13 can cause the organic light emitting display panel to be bent to be downwardly convex. The downwardly convex organic light emitting display panel can result in delamination occurring between the organic light emitting layer and the cathode electrode of the organic light emitting diode layer 12. The problem in the organic light emitting display devices according to the related art increases the need of a technique capable of avoiding water permeation through the side of the organic light emitting diode layer 12 and improving stability of the flexible organic light emitting display device.

SUMMARY OF THE INVENTION

Accordingly, the present invention is directed to an organic light emitting display device that substantially obviates one or more problems due to limitations and disadvantages of the related art. An advantage of the present invention includes providing an organic light emitting display device that prevents (i.e., avoids) water permeation through a side of an organic light emitting diode layer. Another advantage of the present invention includes maintaining reliability against a physical impact. Another advantage of the present invention includes improving reliability of the organic light emitting diode layer by preventing generation of delamination at the organic light emitting diode layer.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device according to one embodiment of the present invention includes an organic light emitting diode layer provided at an active area of a base substrate. The organic light emitting display device includes an encapsulation layer encapsulating the organic light emitting diode layer to protect the organic light emitting diode layer. The encapsulation layer includes an adhesive layer provided to cover an upper surface and a side of the organic light emitting diode layer and an encapsulation substrate. The encapsulation substrate has different thicknesses at the active area and outside the active area to prevent water permeation through the side of the organic light emitting diode layer from occurring.

In another aspect of the present invention, an organic light emitting display device according to another embodiment of the present invention includes an organic light emitting diode layer provided at an active area of a base substrate. The organic light emitting display device includes an encapsulation layer encapsulating the organic light emitting diode layer to protect the organic light emitting diode layer. The encapsulation layer includes an adhesive layer provided to cover an upper surface and a side of the organic light emitting diode layer and an encapsulation substrate. The encapsulation substrate has a step difference at the active area and outside the active area to prevent water permeation through the side of the organic light emitting diode layer from occurring.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
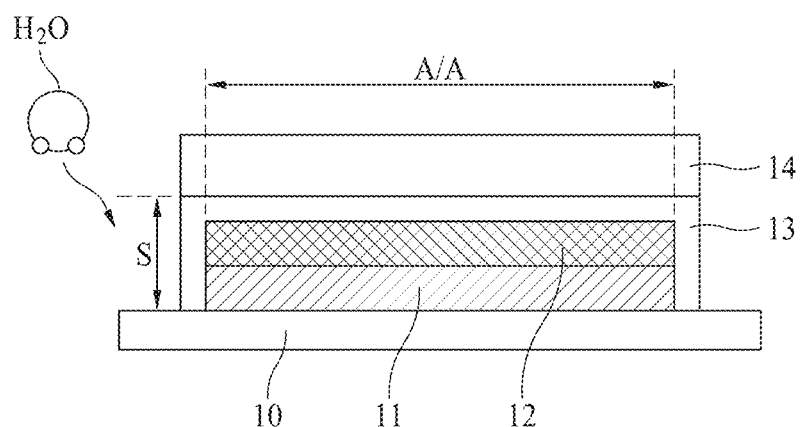
FIG. 1 is a cross-sectional view illustrating an organic light emitting display device of the related art.
Figure 2:
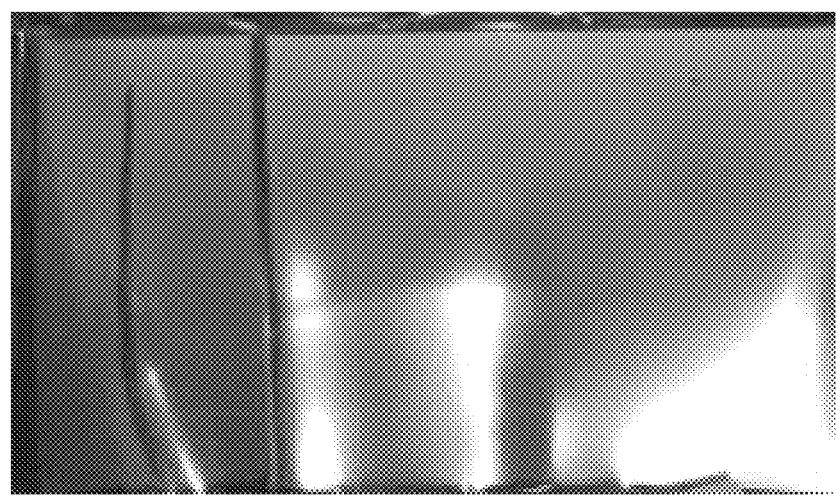
FIG. 2 is a view illustrating delamination between an organic light emitting layer and a cathode electrode of an organic light emitting display device of the related art.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely examples. The present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description. In describing a position relationship, for example, when the position relationship is described as 'upon~', 'above~', 'below~', and 'next to~', one or more portions may be arranged between two other portions unless 'just' or 'direct' is used. In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element could be termed a second element, and, similarly, a second element could be termed a first element, without departing from the scope of the present invention.

Features of various embodiments of the present invention can be partially or overall coupled to or combined with each other, and can be variously inter-operated with each other and driven technically as those skilled in the art can sufficiently understand. The embodiments of the present invention can be carried out independently from each other, or can be carried out together in co-dependent \relationships. Hereinafter, the preferred embodiments of the present invention will be described in detail with reference to the accompanying drawings.

Figure 3:
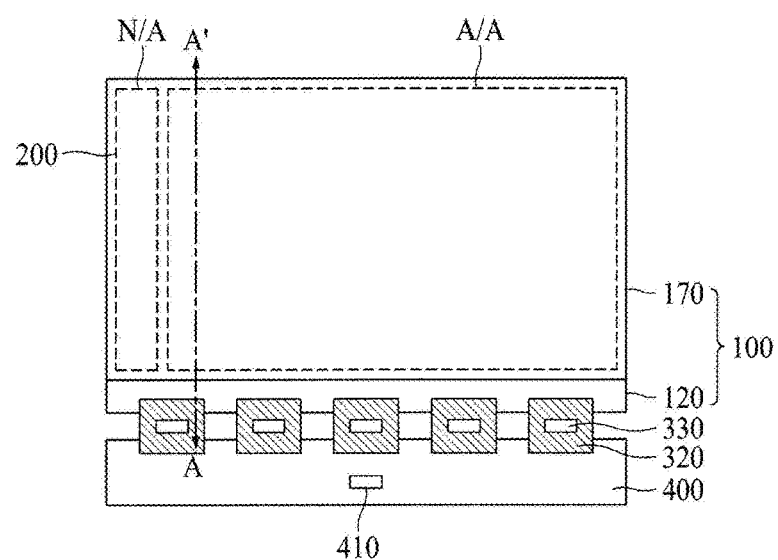
FIG. 3 is a plane view illustrating an organic light emitting display device according to the embodiment of the present invention.

FIG. 3 is a brief plane view illustrating an organic light emitting display device according to a first embodiment of the present invention. The organic light emitting display device according to the first embodiment of the present invention includes an organic light emitting display panel 100, a gate driver 200, flexible films 320, drive ICs 330, a circuit board 400, and a timing controller 410.

The organic light emitting display panel 100 includes a base substrate 120 and an encapsulation substrate 170. A portion of the base substrate 120 is in an active area A/A where an image is displayed. A portion of the base substrate 120 is in a non-display area N/A. Gate lines and data lines can be formed on the active area A/A. Light emitting portions can be respectively formed on crossing areas of the gate lines and the data lines to display an image.

The non-display area N/A is disposed at an edge of one side of the display area A/A. The non-display area N/A can be provided with a gate driver 200 that can include a plurality of thin film transistors.

The base substrate 120 can be formed of an insulating material having flexibility. For example, the base substrate 120 can be, but is not limited to, a sheet or film that includes cellulose resin such as TAC (triacetyl cellulose) or DAC (diacetyl cellulose), COP (cyclic olefin polymer) such as norbornene derivatives, COC (cyclo olefin copolymer), acryl resin such as PMMA (poly(methylmethacrylate)), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

A back film for supporting the base substrate 120 can be further provided on a lower surface of the base substrate 120. In more detail, the back film can be attached to the lower surface of the base substrate 120 through a lamination process and therefore can maintain the base substrate 120 at a plane state.

The encapsulation substrate 170 is provided on the base substrate 120. The encapsulation substrate 170 can be of a metal film type such as metal foil to protect elements provided on the base substrate 120. In more detail, the encapsulation substrate 170 can protect a thin film transistor and an organic light emitting diode layer from external impact, and prevent water from permeating into the organic light emitting display panel 100. The encapsulation substrate 170 is formed to be smaller than the base substrate 120. Thus, some of the base substrate 120 can be exposed without being covered by the encapsulation substrate 170.

Also, an adhesive layer for adhering the base substrate 120 to the encapsulation substrate 170 can be additionally provided between the base substrate 120 and the encapsulation substrate 170. The adhesive layer is provided on an upper surface and a side of the organic light emitting diode layer provided on the base substrate 120 to adhere the encapsulation substrate 170. Thus, the encapsulation substrate 170 can encapsulate the base substrate 120.

As described above, some of the base substrate 120 can be exposed without being covered by the encapsulation substrate 170. Signal pads such as data pads can be provided on an area of the base substrate 120 which is exposed, and is not covered by the encapsulation substrate 170.

The gate driver 200 supplies gate signals to the gate lines in accordance with a gate control signal input from the timing controller 410. In the first embodiment of the present invention, the gate driver 200 can be formed outside one side of the active area A/A of the organic light emitting display panel 100 in a gate driver in panel (GIP) type but is not limited thereto. The gate driver 200 can be formed outside both sides of the active area A/A of the organic light emitting display panel 100 in a GIP mode. The gate driver 200 can be fabricated of a driving chip, packaged in flexible films and attached to the organic light emitting display panel 100 in a tape automated bonding (TAB) type.

The flexible films 320 may be provided with lines which connect the signal pads with the drive ICs 330, and lines which connect the signal pads with lines of the circuit board 400. The flexible films 320 may be attached onto the signal pads by using an anisotropic conducting film. Thus, the signal pads may be connected with the lines of the flexible films 320.

The drive ICs (Integrated Circuits) 330 receive digital video data and a source control signal from the timing controller 410. The drive ICs 330 convert the digital video data to analog data voltages in accordance with the source control signal, and supply the analog data voltages to the data lines. If the drive ICs 330 are fabricated of driving chips, the drive ICs 330 may be packaged in the flexible films 320 in a chip on film (COF) or chip on plastic (COP) type.

The circuit board 400 may be attached to the flexible films 320. A plurality of circuits comprised of driving chips may be packaged in the circuit board 400. For example, the timing controller 410 may be packaged in the circuit board 400. The circuit board 400 may be a printed circuit board (PCB) or a flexible printed circuit board (FPCB).

The timing controller T-con 410 can receive digital video data and a timing signal from an external system board. The timing controller 410 can generate a gate control signal for controlling an operation timing of the gate driver 200 and a source control signal for controlling the drive ICs 330 on the basis of the timing signal. The timing controller 410 can supply the gate control signal to the gate driver 200, and supply the source control signal to the drive ICs 330.

As described above, the encapsulation substrate 170 is adhered onto the base substrate 120 through the adhesive layer. The encapsulation substrate 170 provided in a metal sheet type can effectively avoid permeation of particles such as water due to a material property of the encapsulation substrate 170. But, the adhesive layer can fail to effectively prevent (i.e., avoid) water permeation due to a material property of the encapsulation substrate 170. Thus, in the organic light emitting display device according to the related art, water permeation through the side of the organic light emitting diode layer can deteriorate reliability of the organic light emitting display panel 100. That is, the organic light emitting diode of the organic light emitting display panel 100 in the organic light emitting display device according to the related art can be degraded due to water permeation.

Therefore, in the first embodiment of the present invention, the encapsulation substrate 170 avoids water permeation through the side of the organic light emitting diode layer by enlarging an area at a side of the organic light emitting display device and above the organic light emitting diode layer.

Figure 4:
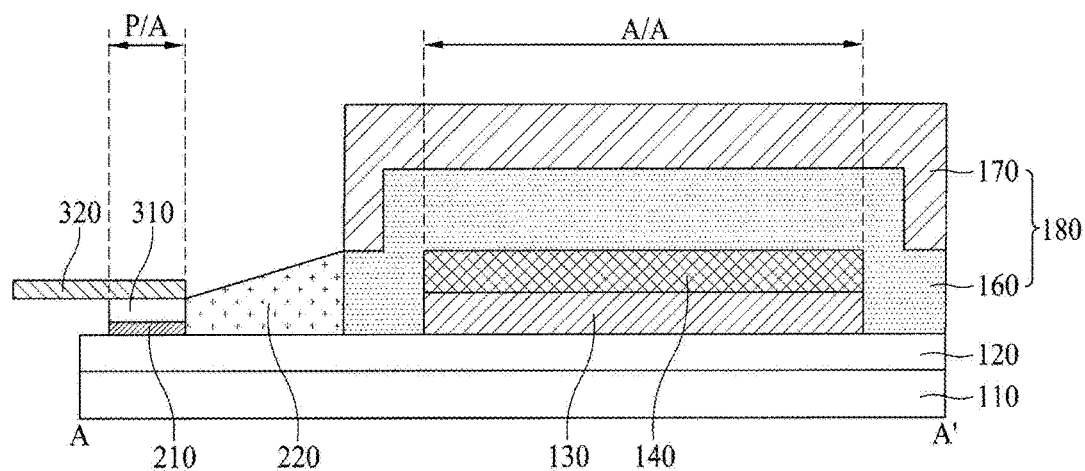
FIG. 4 is a cross-sectional view illustrating an organic light emitting display device according to the first embodiment of the present invention, which is taken along line "A-A'" of FIG. 3.

Next, FIG. 4 is a cross-sectional view illustrating an organic light emitting display device according to the first embodiment of the present invention, which is taken along line "A-A'" of FIG. 3. The organic light emitting display device according to the first embodiment of the present invention includes an active area A/A and a pad area P/A which are provided on the base substrate 120. A thin film transistor layer 130, an organic light emitting diode layer 140, an adhesive layer 160 and an encapsulation substrate 170 are formed at the active area A/A on the base substrate 120.

The thin film transistor layer 130 may include an active layer, a gate insulating film, a gate electrode, an interlayer dielectric, a source electrode, and a drain electrode. The active layer is formed on the base substrate 120 to overlap the gate electrode. The gate insulating film can be formed on the active layer to insulate the active layer from the gate electrode. The gate electrode can be formed on the gate insulating film and can be formed to overlap the active layer by interposing the gate insulating film therebetween. The interlayer dielectric can be formed on the gate electrode. The interlayer dielectric may be made of, but not limited to, the same inorganic insulating material as that of the gate insulating film. The source electrode and the drain electrode can be formed to face each other on the interlayer dielectric. The source electrode can be connected with an end area of the active layer through a contact hole. The drain electrode can be connected with another end area of the active layer through a contact hole.

The structure of the aforementioned thin film transistor layer is not limited to the shown structure. Various modifications may be made in the structure of the thin film transistor layer by the structure known to the person skilled in the art. For example, the thin film transistor layer may have a bottom gate structure in which the gate electrode is formed below the active layer.

The organic light emitting diode layer 140 may include an anode electrode, an organic light emitting layer, and a cathode electrode. The anode electrode can be formed on the thin film transistor layer 130. The anode electrode can be connected with the source electrode of the thin film transistor layer 130 through the contact hole. The anode electrode can serve to upwardly reflect light emitted from the organic light emitting layer. The anode electrode can include a material having excellent reflectivity. The organic light emitting layer can be formed on the anode electrode. The organic light emitting layer may include a hole injecting layer, a hole transporting layer, an emitting layer, an electron transporting layer, and an electron injecting layer. The organic light emitting layer may be modified according to various types known to those skilled in the art. The cathode can be formed on the organic light emitting layer. Because the cathode electrode can be formed on a surface to which light is emitted, the cathode electrode can be made of a transparent conductive material. To reduce a resistance of the cathode electrode, which is made of a transparent conductive material, the cathode electrode may be connected with an auxiliary electrode additionally provided to be spaced apart from the anode electrode.

The structure of the aforementioned organic light emitting diode layer 140 is not limited to the shown structure. Various modifications may be made in the structure of the organic light emitting diode layer 140 by the structure known to the person skilled in the art.

The adhesive layer 160 is provided on the organic light emitting diode layer 140 to cover the upper surface and the side of the organic light emitting diode layer 140. Thus, the organic light emitting diode layer 140 is adhered to the encapsulation substrate 170 via the adhesive layer 160. The base substrate 120 may be sealed in such a manner that the adhesive layer 160 is laminated on the encapsulation substrate 170. The encapsulation substrate 170 on which the adhesive layer 160 is laminated is then bonded to the base substrate 120 provided with the organic light emitting diode layer 140.

The adhesive layer 160 may be a thermosetting or nature hardening adhesive. For example, the adhesive layer 160 may be formed of material such as a pressure sensitive adhesive (PSA), an optical clear adhesive (OCA), or an optical clear resin (OCR).

The encapsulation substrate 170 is provided on the adhesive layer 160 and encapsulates the organic light emitting diode layer 140. As described above, because the adhesive layer 160 is provided to cover the side as well as the upper surface of the organic light emitting diode layer 140, the adhesive layer 160 is provided at the active area A/A on the base substrate 120, and also provided outside the active area A/A on the base substrate 120. And the encapsulation substrate 170 provided on the adhesive layer 160 is also provided both at the active area A/A and outside the active area A/A. Because the adhesive layer 160 and the encapsulation substrate 170 are layers provided to protect the organic light emitting diode layer 140, the adhesive layer 160 and encapsulation substrate 170 may be referred to as an encapsulation layer 180.

The encapsulation substrate 170 according to the first embodiment of the present invention is provided at different thicknesses at the active area A/A and outside the active area A/A (refer to FIG. 4). Thus, water permeation through the adhesive layer 160 provided at the side of the organic light emitting diode layer 140 is prevented (i.e., avoided).

The encapsulation substrate 170 provided at the active area A/A is thinner than the encapsulation substrate 170 provided outside the active area A/A. That is, in the first embodiment of the present invention, the encapsulation substrate 170 having excellent anti-permeation effect is provided more thickly outside the active area A/A to prevent (i.e., avoid) water permeation through the adhesive layer 160.

Because, in the organic light emitting display device according to the related art, the adhesive layer 160 is provided thinly, an anti-water permeation effect through the side of the organic light emitting diode layer 140 is increased. The anti-water permeation effect in the organic light emitting display device according to the related art can cause a crack to occur in an organism of the organic light emitting diode layer 140 due to physical damage caused by external impact.

Therefore, in the first embodiment of the present invention, the thickness of the encapsulation substrate 170 provided outside the active area A/A is only increased. The thickness of the encapsulation substrate 170 provided at the active area A/A is reduced. The thickness of the adhesive layer 160 provided at the active area A/A in the organic light emitting display device according to the first embodiment of the present invention may be increased as compared with the organic light emitting display device of the related art. For example, the adhesive layer 160 provided at the active area A/A may be thicker than the encapsulation substrate 170.

A signal pad 210, an anisotropic conducting film (ACF) 310 and a flexible film 320 are formed in the pad area P/A on the base substrate 120. The signal pad 210 is formed to be spaced apart from the thin film transistor 130 on the base substrate 120, and is connected with an external driving circuit through the flexible film 320 to receive a signal for driving the thin film transistor layer 130. The anisotropic conducting film 310 is provided on the signal pad 210 to attach the flexible film 320 to the signal pad 210. The flexible film 320 is attached onto the signal pad 210 through the anisotropic conducting film 310. The flexible film 320 may be provided with lines connecting the signal pad 210 with the drive ICs, and lines connecting the signal pad 210 with lines of the circuit board.

Also, a cover layer 220 may further be provided between the active area A/A and the pad area P/A on the base substrate 120. The cover layer 220 may include a polymer material, and be coated on the base substrate 120 to cover a link line between the thin film transistor layer 130 and the signal pad 210. The cover layer 220 may be formed of a desiccant material called "tuffy", and prevent water permeation into the link line from occurring while protecting the link line from external impact.

In particular, in the first embodiment of the present invention, the cover layer 220 may be provided to be higher than the adhesive layer 160 at the outside the active area A/A, which adjoins the active area A/A. Thus, water permeation through the adhesive layer 160 may be prevented (i.e., avoided).

That is, as described above, in the first embodiment of the present invention, the encapsulation substrate 170 provided outside the active area A/A may be thicker than the encapsulation substrate 170 provided at the active area A/A. The encapsulation substrate 170 and the cover layer 220 may be provided to adjoin each other at the outside of the active area A/A so that the side of the organic light emitting diode layer 140 may not be exposed through the adhesive layer 160. Because the side of the organic light emitting diode layer 140 is fully covered by the encapsulation substrate 170 and the cover layer 220, water permeation through the adhesive layer 160 may be prevented (i.e., avoided).

Also, the back film 110 for supporting the base substrate 120 may further be provided on a lower surface of the base substrate 120. The back film 110 may be attached to the lower surface of the base substrate 120 through a lamination process, whereby the base substrate 120 may be maintained at a flat plane state.

Figure 5:
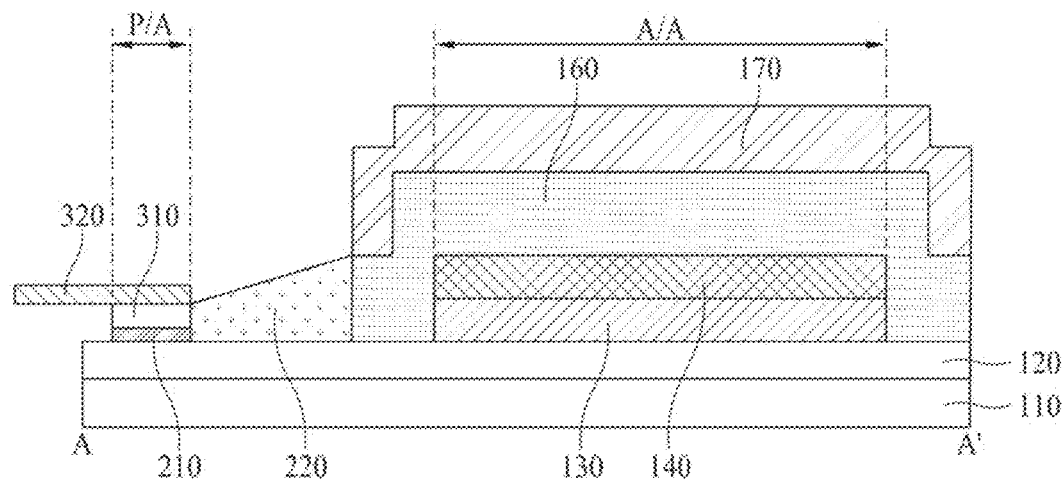
FIG. 5 is a cross-sectional view illustrating an organic light emitting display device according to the second embodiment of the present invention, which is taken along line "A-A'" of FIG. 3.

Next, FIG. 5 is a cross-sectional view illustrating an organic light emitting display device according to the second embodiment of the present invention, which is taken along line "A-A'" of FIG. 3. The organic light emitting display device according to the second embodiment of the present invention is the same as the organic light emitting display device shown in FIG. 4 except that the encapsulation substrate 170 is provided to have a step difference at the active area A/A and outside the active area A/A. Therefore, the same reference numbers will be used throughout the drawings to refer to the same or like parts, and repeated descriptions of the same elements will be omitted.

The encapsulation substrate 170 of the organic light emitting display device according to the second embodiment of the present invention is provided to have a step difference at the active area A/A and outside the active area A/A, whereby water permeation through the adhesive layer 160 provided at the side of the organic light emitting diode layer 140 is prevented (i.e., avoided). Alternatively, the encapsulation substrate 170 of the organic light emitting display device according to the second embodiment of the present invention can be provided to have a sloped (i.e., curved) upper surface outside the active area A/A. The sloped upper surface of the encapsulation substrate 170 outside the active area A/A can be lower near the cover layer 220 outside the active area A/A and higher at the active area A/A.

In addition, the portion of the encapsulation substrate 170 with the sloped (i.e., curved) upper surface outside the active area A/A can have a flat lower surface that is adjacent to a flat upper surface of a relatively lower portion of the adhesive layer 160. Alternatively, the portion of the encapsulation substrate 170 with the sloped (i.e., curved) upper surface outside the active area A/A can have a sloped (i.e., curved) lower surface outside the active area A/A. The encapsulation substrate 170 with the sloped (i.e., curved) upper surface outside the active area A/A and with the sloped (i.e., curved) lower surface can taper (i.e., become more narrow) to form a point (i.e., conical structure) at a lowermost extremity of the encapsulation substrate 170 outside the active area A/A. The point of the at the lowermost extremity of the encapsulation substrate 170 outside the active area A/A can contact the adhesive layer 160.

Because the adhesive layer 160 is provided to cover the side as well as the upper surface of the organic light emitting diode layer 140, the adhesive layer 160 is provided outside the active area A/A as well as at the active area A/A on the base substrate 120. And the encapsulation substrate 170 provided on the adhesive layer 160 is also provided at the active area A/A and outside the active area A/A.

The encapsulation substrate 170 according to the second embodiment of the present invention is provided to have a step difference at the active area A/A and outside the active area A/A. The encapsulation substrate 170 outside the active area A/A has a step difference to be provided at a relatively lower portion, that is, at a position lower than that of the encapsulation substrate 170 at the active area A/A. Thus, water permeation through the adhesive layer 160 provided at the side of the organic light emitting diode layer 140 is prevented (i.e., avoided).

The encapsulation substrate 170 in the second embodiment of the present invention is provided more thickly outside the active area A/A than the encapsulation substrate 170 provided at the active area A/A, whereby water permeation at the side of the organic light emitting diode layer 140 may be prevented (i.e., avoided) more effectively. Also, in the second embodiment of the present invention, if the cover layer 220 is further provided between the active area A/A and the pad area P/A on the base substrate 120, the cover layer 220 can be provided to equal in height to a lower portion of the adhesive layer 160 at the outside of the active area A/A, which adjoins the active area A/A. Thus, water permeation through the adhesive layer 160 may be prevented (i.e., avoided). Alternatively, the cover layer 220 can be provided to be higher than (i.e., above) the lower portion of the adhesive layer 160 at the outside of the active area A/A. Alternatively, the cover layer 220 can be provided to be higher than (i.e., above) a higher portion of the adhesive layer 160 at the outside of the active area A/A. The cover layer 220 be flat and can be lower next to the pad area and higher next to the adhesive layer 160. Alternatively, the cover layer 220 be curved (i.e., sloped) and can be lower next to the pad area and higher next to the adhesive layer 160.

That is, as described above, in the second embodiment of the present invention, the encapsulation substrate 170 provided outside the active area A/A is thicker than the encapsulation substrate 170 provided at the active area A/A. The encapsulation substrate 170 and the cover layer 220 may be provided to adjoin each other outside the active area A/A so that the side of the organic light emitting diode layer 140 may not be exposed through the adhesive layer 160. Because the side of the organic light emitting diode layer 140 is fully covered by the encapsulation substrate 170 and the cover layer 220, water permeation through the adhesive layer 160 may be prevented (i.e., avoided).

Also, in the second embodiment of the present invention, the encapsulation substrate 170 provided at the active area A/A is thinner than that of the organic light emitting display device of the related art. In addition, the adhesive layer 160 of organic light emitting display device according to the second embodiment of the present invention is thicker than that of the organic light emitting display device of the related art. Thus, stable flexibility of the organic light emitting display device according to the present invention may be obtained.

A flexible organic light emitting display device has a flexural rigidity calculated as expressed by the following Equation 1.

$$FlexuralRigidity = \frac{E \times h^3}{12(1-v^2)} \quad \text{[Equation 1]}$$

In the Equation 1, E means modulus of each layer, h means a height of each layer, and υ means a Poisson's ratio. A great value of flexural rigidity of the organic light emitting display device means that the organic light emitting display device is not bent well, which in turn means that undesirable flexibility is reduced.

That is, flexural rigidity of the organic light emitting display panel is varied depending on modulus and thickness of various layers deposited on the panel. In the deposition structure of the organic light emitting display device, the encapsulation substrate 170 is provided most thickly with a modulus value of several hundreds of GPa, but each of the other layers except the encapsulation substrate 170 has a modulus value of several GPa or less.

Therefore, flexibility of the organic light emitting display panel is determined primarily depending on a property of the encapsulation substrate 170. A greater thickness of the encapsulation substrate 170 minimizes flexibility of the organic light emitting display panel.

Figure 6:
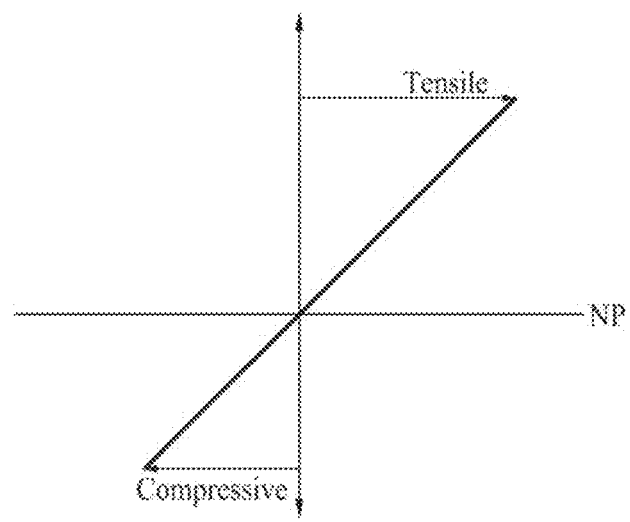
FIG. 6 is a view illustrating a relative size of a tensile force and a compressive force based on a neutral plane if a bending occurs in a flexible organic light emitting display device.

Next, FIG. 6 is a view illustrating a relative size of a tensile force and a compressive force based on a neutral plane if a bending occurs in a flexible organic light emitting display device. A relative size of a tensile force and a compressive force, which occur up and down, respectively, based on a neutral plane (NP) if the organic light emitting display device can be bent to be upwardly convex (refer to FIGS. 4 and 5).

That is, a tensile force is relatively increased toward an upper portion based on the neutral plane. A compressive force is relatively increased toward a lower portion based on the neutral plane if the organic light emitting display device is bent to be upwardly convex (refer to FIG. 6). Because various layers are deposited in the organic light emitting display device, if too great of a tensile or compressive force is applied, a stability of the organic light emitting display device according to the related art may be reduced.

The neutral plane is determined as a position where flexural rigidity of the layers deposited at an upper portion based on the neutral plane has the same value as that of flexural rigidity of the layers deposited at a lower portion based on the neutral plane. In the organic light emitting display device according to the related art, because the encapsulation substrate is thick, the neutral plane is formed at a relatively high position, such as at a boundary area between the adhesive layer and the encapsulation substrate. If the organic light emitting display device according to the related art is bent, problems occur in that a strong tensile or compressive force is applied to the organic light emitting diode layer; and delamination occurs between the cathode electrode and the organic light emitting layer provided in the organic light emitting diode layer.

That is, adhesion between the organic light emitting layer made of an organism and the cathode electrode made of metal is weak due to a difference in property of each material. If a strong tensile or compressive force is applied to the organic light emitting diode layer, a problem exists in that delamination occurs between the organic light emitting layer and the cathode electrode. To solve the problem of delamination, the adhesive layer and the encapsulation substrate of the organic light emitting display device according to the second embodiment of the present invention may be provided at a thickness that allows the neutral plane to be disposed in the thin film transistor layer below the organic light emitting diode layer.

Figure 7A:
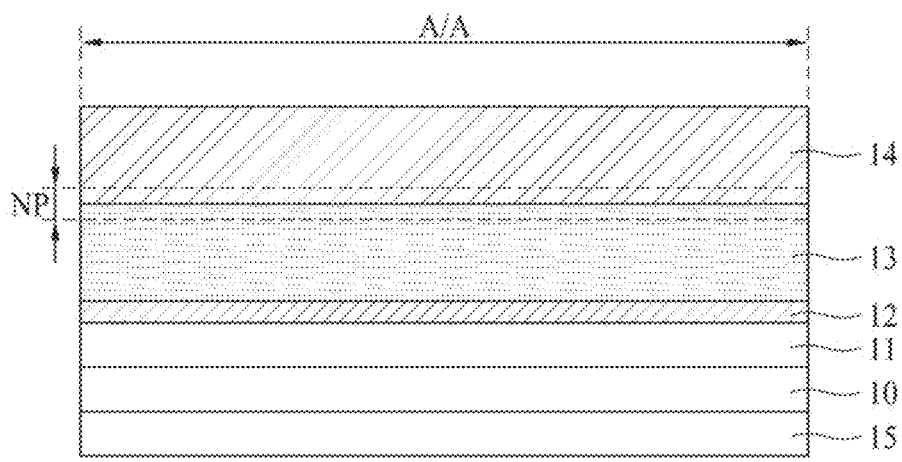
FIGS. 7A and 7B are views illustrating that a position of a neutral plane in an organic light emitting display device of the related art is compared with a position of a neutral plane of an organic light emitting display device according to the embodiment of the present invention.
Figure 7B:
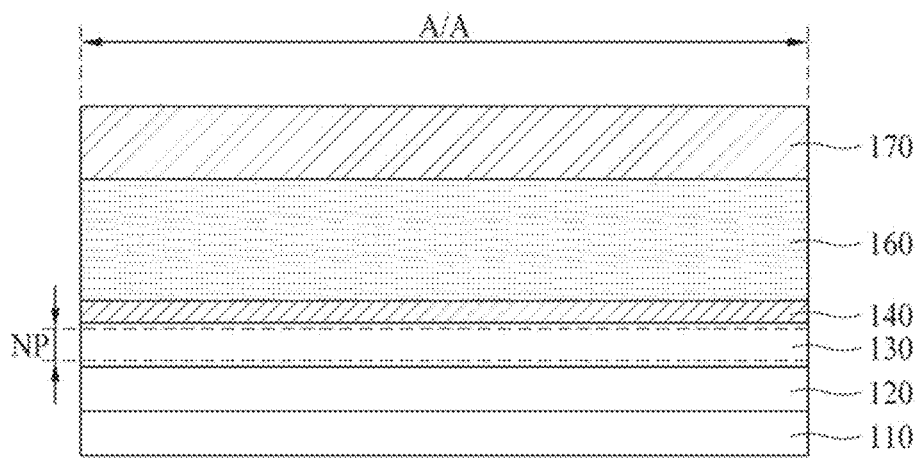

Next, FIGS. 7A and 7B are views illustrating that a position of a neutral plane in an organic light emitting display device of the related art, and a position of a neutral plane of an organic light emitting display device according to the second embodiment of the present invention, respectively. The neutral plane in the organic light emitting display device of the related is disposed at the boundary area between the adhesive layer and the encapsulation substrate due to the thickness of the encapsulation substrate (refer to FIG. 7A). The neutral plane in the organic light emitting display device of the second embodiment of the present invention is disposed in the thin film transistor layer due to the thicknesses of the adhesive layer and the encapsulation substrate (refer to FIG. 7B).

Each of the organic light emitting display device of the related art (refer to FIG. 7A) and the organic light emitting display device of the present invention (refer to FIG. 7B) may include a back film 15, 110, a base substrate 10, 120, a thin film transistor layer 11, 130, an organic light emitting diode layer 12, 140, an adhesive layer 13, 160, and an encapsulation substrate 14, 170. The organic light emitting display device according to the second embodiment of the present invention includes the encapsulation substrate 170 at the active area A/A that is relatively thinner than the encapsulation substrate 170 at the active area A/A of the (refer to FIG. 7B). The adhesive layer 160 of the organic light emitting display device of the present invention (refer to FIG. 7B) is relatively thicker than the adhesive layer 13 of the organic light emitting display device of the related art (refer to FIG. 7A). In the second embodiment of the present invention, the neutral plane NP and the thin film transistor 130 are below the organic light emitting layer 140; and the base substrate 120 can be below the thin film transistor 130 and the organic light emitting layer 140. The neutral plane NP can be disposed in the thin film transistor layer 130. Alternatively, the neutral plane NP can be disposed in an upper portion of the base substrate 120.

In more detail, the thickness of the adhesive layer 160 may increase and the thickness of the encapsulation substrate 170 may be reduced, such that flexural rigidity of the elements deposited on the thin film transistor layer 130 is the same as that of flexural rigidity of the elements deposited below the thin film transistor layer 130. Thus, the position of the neutral plane may be controlled. Because only a weak tensile or compressive force is applied to the organic light emitting diode layer 140, stable flexibility of the organic light emitting display device may be achieved.

The neutral plane may be disposed in the organic light emitting diode layer by controlling the thicknesses of the adhesive layer and the encapsulation substrate, so as to apply a minimum tensile or compressive force to the organic light emitting diode layer.

The neutral plane in the organic light emitting display device according to the second embodiment of the present invention can be controlled to be disposed in the thin film transistor layer 130 as described above. Because the neutral plane is disposed in the organic light emitting diode layer 140, a minimum tensile or compressive force may be applied to the organic light emitting diode layer 140 (refer to FIG. 6).

If the organic light emitting display device is bent, different external forces are respectively applied to an upper area and a lower area based on the neutral plane in the organic light emitting diode layer 140, such as if a tensile force is applied to one area and a compressive force is applied to the other area, or vice versa. Because, in the organic light emitting display device according to the related art, different external forces are respectively applied to the upper area and the lower area of the same layer. Delamination occurs between the organic light emitting layer and the cathode electrode of the organic light emitting diode layer 140 due to a shear stress as a result of the different external forces.

However, the adhesive layer 160 and the encapsulation substrate 170 in the organic light emitting display device according to the second embodiment of the present invention are provided in such a manner that the thicknesses of the adhesive layer 160 and the encapsulation substrate 170 at the active area A/A are different from those of the adhesive layer 160 and the encapsulation substrate 170 outside the active area A/A. Thus, the neutral plane may be disposed in the thin film transistor layer 130 not the organic light emitting diode layer 140. The adhesive layer 160 at the active area A/A is provided to have a thick thickness. The encapsulation substrate 170 at the active area A/A is provided to have a thin thickness. Because the electrodes constituting the thin film transistor layer 130 are deposited most stably and therefore may tolerate a shear stress, the adhesive layer 160 and the encapsulation substrate 170 in the organic light emitting display device according to the second embodiment of the present invention are provided such that the neutral plane is disposed in the thin film transistor layer 130.

Next, FIGS. 8A to 8D are cross-sectional views illustrating process steps of a method for manufacturing an adhesive layer and an encapsulation substrate of an organic light emitting display device according to the first embodiment of the present invention (refer to FIG. 4). Therefore, the same reference numbers will be used throughout the drawings to refer to the same or like parts, and repeated description in material and structure of each element will be omitted.

Figure 8A:
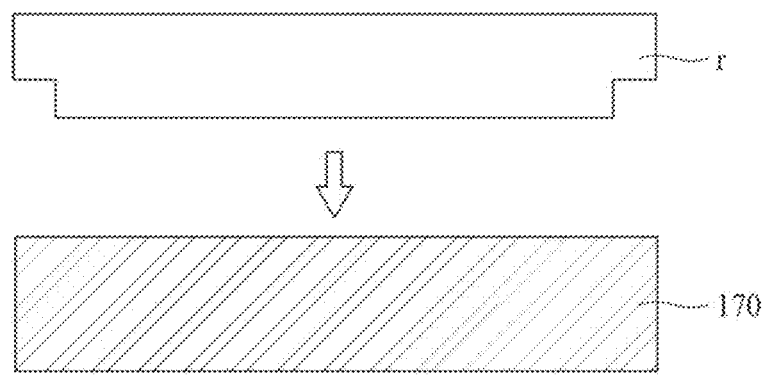
FIGS. 8A to 8D are cross-sectional views illustrating process steps of a method for manufacturing an adhesive layer and an encapsulation substrate of an organic light emitting display device according to the first embodiment of the present invention.

Referring to FIG. 8a, the method of manufacturing the organic light emitting display device according to the first embodiment of the present invention includes providing a roller 'r' of which a center area corresponding to the active area A/A of the organic light emitting display device is convex. The encapsulation substrate 170 is then provided.

Figure 8B:
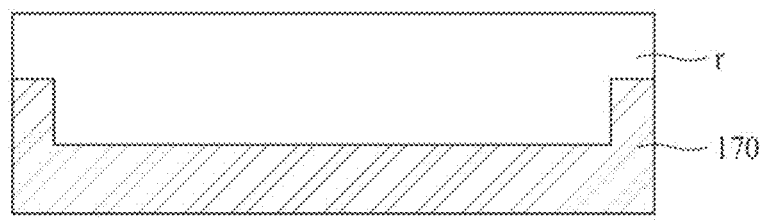

Referring to FIG. 8B, the method of manufacturing the organic light emitting display device according to the first embodiment of the present invention then includes applying rolling to the encapsulation substrate 170 by the roller 'r', whereby the encapsulation substrate 170 provided more thinly at the area corresponding to the active area A/A is obtained. Particularly, in the first embodiment of the present invention, the encapsulation substrate 170 should be formed to have a thin thickness such that the neutral plane may be formed at a desired position of the active area A/A. Therefore, rolling through the roller 'r' is performed by a force that allows the encapsulation substrate 170 to be provided at a desired thickness at the active area A/A.

Figure 8C:
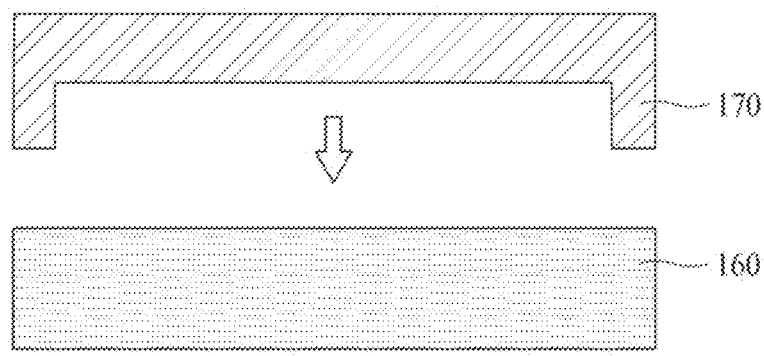

Referring to FIG. 8C, the method of manufacturing the organic light emitting display device according to the first embodiment of the present invention then includes forming an adhesive to form the adhesive layer 160 and the encapsulation substrate 170. The adhesive layer 160 is laminated on the encapsulation substrate 170. Although the adhesive layer 160 is fully laminated on the encapsulation substrate 170 provided at a thin thickness at the area corresponding to the active area A/A in FIG. 8C, the present invention is not limited to FIG. 8C. The adhesive layer 160 may be laminated on the encapsulation substrate 170 through a roller.

Figure 8D:

Referring to FIG. 8D, the method of manufacturing the organic light emitting display device according to the first embodiment of the present invention then includes forming the encapsulation substrate 170 and the adhesive layer 160. The encapsulation substrate 170 and the adhesive layer 160 are provided at different thicknesses at the area corresponding to the active area A/A and outside the active area A/A. The encapsulation substrate 170 and the adhesive layer 160 are bonded to the organic light emitting diode layer provided on the base substrate, whereby the organic light emitting display device in which the organic light emitting diode layer is encapsulated may be obtained.

Figure 9A:
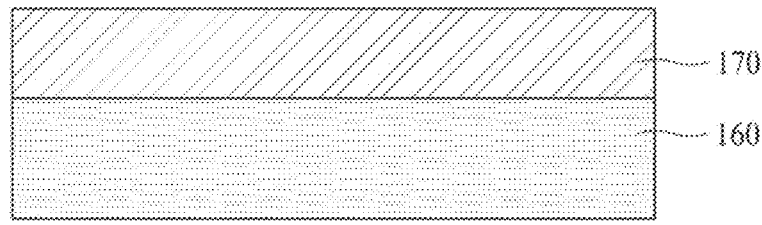
FIGS. 9A to 9C are cross-sectional views illustrating process steps of a method for manufacturing an adhesive layer and an encapsulation substrate of an organic light emitting display device according to the second embodiment of the present invention.
Figure 9B:
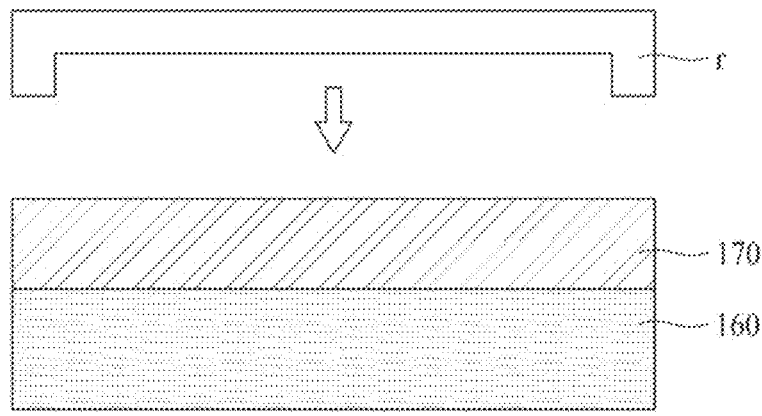
Figure 9C:
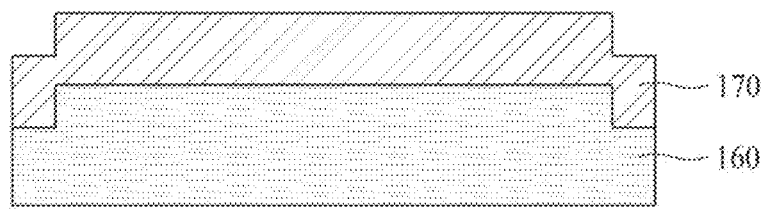

Next, FIGS. 9A to 9C are cross-sectional views illustrating process steps of a method for manufacturing an adhesive layer and an encapsulation substrate of an organic light emitting display device according to the second embodiment of the present invention (refer to FIG. 5). Therefore, the same reference numbers will be used throughout the drawings to refer to the same or like parts, and repeated description in material and structure of each element will be omitted.

Referring to FIG. 9A, the method of manufacturing the organic light emitting display device according to the second embodiment of the present invention includes preparing an adhesive layer 160 and an encapsulation substrate 170. The adhesive layer 160 and the encapsulation substrate 170 are laminated at a length that may cover an upper surface and a side of an organic light emitting diode layer of the organic light emitting display device.

Referring to FIG. 9B, the method of manufacturing the organic light emitting display device according to the second embodiment of the present invention then includes preparing a roller 'r' of which center area corresponding to the active area A/A of the organic light emitting display device is convex. Rolling is applied to the upper surface of the encapsulation substrate 170 and the adhesive layer 160 by the roller 'r'. In the second embodiment of the present invention, the encapsulation substrate 170 should be formed to have a thin thickness such that the neutral plane may be formed at a desired position of the active area A/A. Rolling through the roller 'r' is performed by a force that allows the encapsulation substrate 170 to be provided at a desired thickness at the active area A/A.

Referring to FIG. 9C, the method of manufacturing the organic light emitting display device according to the second embodiment of the present invention then includes obtaining the encapsulation substrate 170 and the adhesive layer 160. Each of the encapsulation substrate 170 and the adhesive layer 160 is provided to have a step difference at the area corresponding to the active area A/A and outside the active area A/A.

As described above, according to the present invention, the following advantages may be obtained. The encapsulation substrate is provided to have different thicknesses at the active area and outside the active area, and the length of the encapsulation substrate covering the organic light emitting diode layer is increased outside the active area, whereby water permeation at the side of the organic light emitting diode layer may be prevented (i.e., avoided).

Also, according to the present invention, the encapsulation substrate is provided to have a step difference at the active area and outside the active area, and the length of the encapsulation substrate covering the organic light emitting diode layer is increased outside the active area, whereby water permeation at the side of the organic light emitting diode layer may be prevented (i.e., avoided).

Also, according to the present invention, the adhesive layer and the encapsulation substrate within the active area are provided at the thicknesses such that the neutral plane may be disposed in the thin film transistor layer, whereby a weak tensile or compressive force may only be applied to the organic light emitting diode layer to achieve stable flexibility.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible organic light emitting device comprising:
   a flexible substrate having an active area and a pad area;
   an organic light emitting diode layer disposed on the active area;
   an adhesive layer disposed on the organic light emitting diode layer;
   an encapsulation substrate disposed on the adhesive layer;
   a cover layer disposed between the active area and the pad area; and
   a back film disposed on a lower surface of the flexible substrate,
   wherein the encapsulation substrate has a curved upper surface outside the active area,
   wherein the cover layer decreases in thickness from the active area toward the pad area, and
   wherein the curved upper surface of the encapsulation substrate outside the active area is lower near the cover layer and higher at the active area.

2. The flexible organic light emitting device of claim 1, wherein the cover layer is coated on the flexible substrate.

3. The flexible organic light emitting device of claim 1, wherein the cover layer is disposed lower than the encapsulation substrate.

4. The flexible organic light emitting device of claim 1, wherein the cover layer is sloped from a first portion to a second portion.

5. The flexible organic light emitting device of claim 1, wherein the cover layer comprises a curved portion.

6. The flexible organic light emitting device of claim 1, wherein a length of the encapsulation substrate is increased outside the active area.

7. The flexible organic light emitting device of claim 1, wherein the back film is supporting the flexible substrate.

8. A flexible organic light emitting device comprising:
   a flexible substrate having an active area and a pad area;
   an organic light emitting diode layer disposed on the active area;
   an adhesive layer disposed on the organic light emitting diode layer;
   an encapsulation substrate disposed on the adhesive layer;
   a cover layer disposed between the active area and the pad area; and
   a back film disposed on a lower surface of the flexible substrate,
   wherein the encapsulation substrate has a curved upper surface outside the active area,
   wherein the cover layer decreases in thickness from the active area toward the pad area, and
   wherein the cover layer contacts the adhesive layer outside the active area.

9. A flexible organic light emitting device comprising:
   a flexible substrate having an active area and a pad area;
   an organic light emitting diode layer disposed on the active area;
   an adhesive layer disposed on the organic light emitting diode layer;
   an encapsulation substrate disposed on the adhesive layer;
   a cover layer disposed between the active area and the pad area; and
   a back film disposed on a lower surface of the flexible substrate,
   wherein the encapsulation substrate has a curved upper surface outside the active area,
   wherein the cover layer decreases in thickness from the active area toward the pad area, and
   wherein the cover layer is higher than a lower portion of the adhesive layer at the outside of the active area.

10. A flexible organic light emitting device comprising:
    a flexible base substrate having an active area and a pad area;
    a thin film transistor disposed on the active area;
    an organic light emitting diode layer disposed on the active area;
    an encapsulation film disposed on the thin film transistor and the organic light emitting diode layer to protect the thin film transistor and the organic light emitting diode layer;
    a cover layer disposed between the active area and the pad area; and
    a back film disposed on a lower surface of the flexible base substrate,
    wherein the cover layer includes a first portion adjacent to the active area and a second portion adjacent to the pad area, the first portion being thicker than the second portion,
    wherein the pad area is spaced from the active area by a first distance, and
    wherein the cover layer extends an entirety of the first distance from the active area to the pad area.

11. The flexible organic light emitting device of claim 10, wherein the encapsulation film is a metal film type.

12. The flexible organic light emitting device of claim 10, wherein the encapsulation film has different thickness at the active area and outside the active area.

13. The flexible organic light emitting device of claim 10, wherein the cover layer decreases in thickness from the active area toward the pad area.

14. The flexible organic light emitting device of claim 10, wherein the cover layer is sloped from the first portion to the second portion.

15. The flexible organic light emitting device of claim 10, wherein the cover layer comprises a curved portion.

16. The flexible organic light emitting device of claim 10, wherein the encapsulation film is fully covering a side of the organic light emitting diode layer.

\* \* \* \* \*